United States Patent

Legare et al.

[11] Patent Number: 5,168,001
[45] Date of Patent: Dec. 1, 1992

[54] PERFLUOROPOLYMER COATED PELLICLE

[75] Inventors: John M. Legare, Newark; Anestis L. Logothetis; Duck J. Yang, both of Wilmington, all of Del.

[73] Assignee: E. I. Du Pont de Nemours and Company, Wilmington, Del.

[21] Appl. No.: 703,220

[22] Filed: May 20, 1991

[51] Int. Cl.⁵ .............................................. B32B 3/00
[52] U.S. Cl. .................................... 428/194; 428/422; 428/412; 428/463
[58] Field of Search ............... 428/194, 422, 913, 412, 428/463

[56] References Cited

U.S. PATENT DOCUMENTS

| | | | |
|---|---|---|---|
| 4,970,099 | 11/1990 | Adams et al. | 428/422 |
| 5,008,156 | 4/1991 | Hong | 428/522 |
| 5,061,024 | 10/1991 | Keys | 359/350 |

FOREIGN PATENT DOCUMENTS

| | | |
|---|---|---|
| 0300661 | 1/1989 | European Pat. Off. |
| 61-209449 | 9/1986 | Japan |
| 2-041329 | 2/1990 | Japan |
| 2-285348 | 11/1990 | Japan |

*Primary Examiner*—Patrick J. Ryan
*Assistant Examiner*—W. Krynski

[57] ABSTRACT

Pellicles having films bearing at least one coating of perfluoropolymers as an antireflective surface, the perfluoropolymers comprising a low molecular weight perfluoropolymer having randomly copolymerized units of tetrafluoroethylene, perfluoro (alkyl vinyl) ether and a cure site monomer, the cure site monomer selected from the group consisting of vinylidene fluoride, perfluoro-(8-cyano-5-methyl-3,6-dioxa-1-octene), bromotetrafluorobutene or perfluoro (2-phenoxypropyl vinyl ether). Pellicles of this type are dust defocusing covers for photomasks and reticles used to project patterns onto light sensitive substrates such as photoresist-coated semiconductor wafers which are used in the manufacture of integrated circuits.

9 Claims, 1 Drawing Sheet

PERFLUOROPOLYMER COATED PELLICLE

FIELD OF THE INVENTION

The invention relates to a pellicle which is used as a dust defocusing cover for a photomask. More specifically, the invention relates to a pellicle having at least one antireflective layer which enables the pellicle to transmit a greater percentage of incident light to the photomask.

BACKGROUND OF THE INVENTION

Projection printing systems for forming an image on a light sensitive substrate or wafer are particularly suitable for effecting the exposure of photoresist-coated semiconductor wafers in the manufacture of integrated circuits. These systems normally include a photomask or reticle (hereinafter "mask") having a transparent substrate with a pattern of opaque and transparent areas formed on one surface thereof, an illumination system for directing a beam of radiant energy such as light or ultraviolet rays through the mask to the wafer, optical means for forming a focused image of the mask pattern on the wafer and a pellicle for maintaining the images of any dust particles out of focus on the surface of the mask.

The pellicle is a free-standing thin optical film supported on a frame. Normally, the frame is attached to the mask and the optical film stands away from the mask surface by a given distance. Dust particles which might otherwise settle on the mask and be projected onto the wafer, will settle on the pellicle instead and be defocused. Consequently, when pellicles are used in a conventional projection printing system, one or more dust particles will not affect the yield of a given wafer and yields can be significantly improved.

Ideally, pellicles should be invisible to the radiant energy of the projection printing system. That is, in order to produce clear, well-defined patterns, the optical film of the pellicle should transmit all of the radiant energy used during the projection printing process, with no reflection.

In the past, single layer pellicles, typically made of nitrocellulose, have been used. With increasing miniaturization, the pattern elements have become smaller and the optical transmission of the pellicle films has become increasingly insufficient. In order to increase the optical transmission of pellicle films, that is, reduce their optical reflectiveness or glare, and thus produce clear, well-defined patterns, multilayer pellicles with various antireflective coatings have previously been proposed. Such coatings have included fluoropolymers which provided good optical characteristics. However, continuing effort has been directed to the preparation of antireflective coatings which exhibit the best possible combination of optical properties and adhesion to the core materials used for pellicle films.

SUMMARY OF THE INVENTION

The invention is directed to an improved pellicle having a coating which has excellent optical characteristics and adhesion to core materials of pellicle films.

Specifically, the instant invention provides, in a pellicle comprising an optically transparent film which is tautly adhered to one edge of a closed support frame, the film comprising a core layer having an index of refraction of about 1.32 to 1.80 and a thickness of 0.3 to 20 microns, the improvement wherein the film further comprises at least one antireflective layer comprising a low molecular weight perfluoropolymer having randomly copolymerized units of tetrafluoroethylene, perfluoro (alkyl vinyl) ether and a cure site monomer, the cure site monomer being selected from group consisting of vinylidene fluoride, perfluoro-(8-cyano-5-methyl-3,6-dioxa-1-octene), bromotetrafluorobutene or perfluoro (2-phenoxypropyl vinyl ether). The aforementioned perfluoropolymers have a typical material composition as follows: 40–60% tetrafluoroethylene, 35–55% perfluoro (alkyl vinyl) ether and 0–5% cure site monomer, by weight of the perfluoropolymer. Low molecular weight perfluoropolymers are prepared under pyrolysis conditions, and are further characterized by having a maximum inherent viscosity of 0.50 at 30° C.

DETAILED DESCRIPTION OF THE INVENTION

Figure 1:
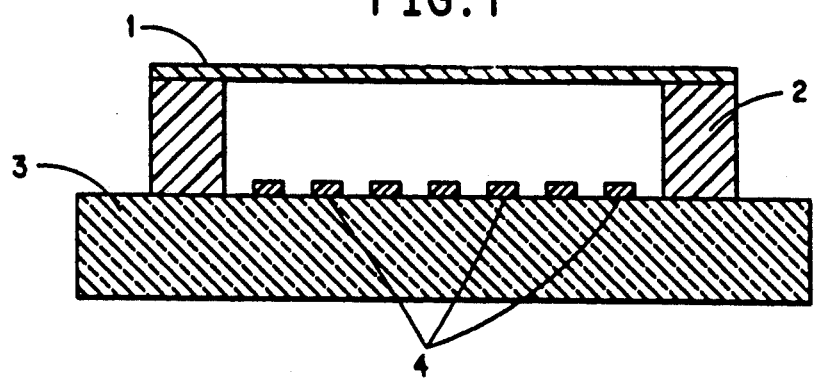
FIG. 1 is a schematic cross-sectional view of a pellicle of the present invention, positioned on a mask.

The pellicles of the present invention include a film having a core layer and at least one perfluoropolymer layer on at least one surface of the core.

The core layer of the pellicle film has an index of refraction of 1.32 to 1.80 and a thickness of 0.3 to 20 microns. Preferably, the core layer has an index of refraction of 1.51 and a thickness of 0.8 to 3.0 microns. Materials known in the art for making uncoated pellicles may be used as the core layer of the invention. These materials are capable of forming a free-standing, isolatable film of substantially uniform thickness having a low level of particulates and low absorption of incident light. A film of this type is considered uniform if the thickness varies by less than 2 wavelengths of exposure frequency per inch. A "low level of particulates" means the film contains less than 20 visible particles and no particles greater than 20 microns. "Low absorption" means that less than 1% incident light is absorped by the film.

Preferably, the core layer comprises a polymer selected from the group consisting of polycarbonates, polyacrylates, polyvinylbutyrates, polyethersulfones and cellulose derivatives such as cellulose acetate, cellulose acetate butyrate or nitrocellulose. Nitrocellulose films have been found to be particularly satisfactory, and are accordingly preferred.

The central feature of the present invention is a coating, on at least one surface of the core layer, of perfluoropolymer at least one antireflective layer comprising a low molecular weight perfluoropolymer having randomly copolymerized units of tetrafluoroethylene, perfluoro (alkyl vinyl) ether and a cure site monomer, the cure site monomer being selected from the group consisting of vinylidene fluoride, perfluoro-(8-cyano-5-methyl-3,6-dioxa-1-octene), bromotetrafluorobutene or perfluoro (2-phenoxypropyl vinyl ether). The aforementioned perfluoropolymers have a typical material composition as follows: 40–60% tetrafluoroethylene, 35–55% perfluoro (alkyl vinyl) ether and 0–5% cure site monomer, by weight of the perfluoropolymer. Low molecular weight perfluoropolymers are prepared under pyrolysis conditions, and are further characterized by having a maximum inherent viscosity of 0.50 at 30° C.

A preferred antireflective layer of the invention comprises a low molecular weight perfluoropolymer having randomly copolymerized units of tetrafluoroethylene, perfluoro (methyl vinyl) ether and a perfluoro-(8-cyano-5-perfluoro-(8-cyano-5-methyl-3,6-dioxa-1-octene) cure site present in an amount from trace quantities to 1.0 percent by weight of the perfluoropolymer. The low molecular weight perfluoropolymer is prepared by pyrolysis for 10 hrs. at 345° C. and is further characterized by having an inherent viscosity of 0.40 at 30° C.

The perfluoropolymers can be coated onto one or both sides of the core layer to form the pellicle film. The perfluoropolymers can be applied from a solvent which is incompatible with the underlying layers and which evaporates after application to produce a uniform antireflective layer. An incompatible solvent is one which does not dissolve or degrade any underlying layer. Such solvents include fluorocarbons such as those commercially available from 3M Company, St. Paul, MN as Fluorinert® FC-40 Electronic Liquid which comprises perfluoro trialkyl amines, Fluorinert® FC-75 Electronic Liquid which comprises perfluoro(2-butyl-tetrahydrofuran) and Fluorinert® FC-77 Electronic Liquid which comprises a fully fluorinated organic compound with a typical molecular weight range of 300-1000.

The coated pellicle films of the invention can be produced by methods known in the art, e.g. Japanese patent publication Kokai Patent No. 60-237450.

In a preferred method, the core layer is produced by dissolving a core layer-forming material in a solvent and spin coating the solution onto a glass substrate. A solution suitable for spin coating should wet the substrate, form a uniform coating on the substrate and dry uniformly. After the solution is coated onto the spinning substrate, spinning is stopped and the coating is heated to evaporate solvent and form a uniform core layer. This uniform core layer is isolated from the substrate onto a lifting frame. The lifting frame is mounted onto a spin coater and the antireflective coating is formed on the core layer by spin coating a suitable solution of the fluoropolymer. A suitable spin coating solution of the fluoropolymer is formed by dissolving the fluoropolymer in a solvent which is incompatible with (i.e., will not dissolve or otherwise degrade) the core layer. The resultant fluoropolymer solution is typically filtered through a 0.2 micron absolute filter and preferably through a 0.1 micron absolute filter prior to being spin coated onto the core layer. If an anti-reflective layer is desired on both sides of the core layer, the lifting frame is raised off the spin coater, rotated 180° to expose the opposite side of the core layer, and remounted on the spin coater. The opposite side of the core layer is then coated with the fluoropolymer solution in the manner described above.

The optimal thickness of the antireflective layer will vary depending on the refractive index of the antireflective layer material and the wavelength of energy that will be used. For example, a single transparent layer will reduce surface reflection if the refractive index of the layer is less than that of the substrate to which it is applied and the layer is of appropriate thickness. If the index of refraction of the layer material is exactly equal to the square root of that of the substrate, all surface reflection of light will be eliminated for that wavelength at which the product of refractive index times thickness is equal to one-quarter of the wavelength. At other wavelengths, the destructive interference between light reflected from top and bottom surfaces of the antireflective layer is not complete; but, nonetheless, there is a reduction in overall reflectiveness.

The coated core layer and the lifting frame to which it is attached are removed from the spin coater and heated to evaporate solvent. The resulting film is then appropriately adhered to a closed support frame by a suitable adhesive and extends tautly across the support frame, which is smaller than the lifting frame. The side of the support frame opposite the adhered film is secured to a mask surface, the pellicle film suspended above the pattern on the surface of the mask. If only one side of the core layer has an antireflective layer thereon, the side lacking the antireflective layer is preferably adhered to the support frame. If both sides of the pellicle film have an antireflective layer, either side may be adhered to the support frame.

Conventional glues and adhesives may be used to adhere the film to the frame provided the glue or adhesive does not contain a solvent for the core layer. Alternatively, the film may be adhered to the frame by heat press lamination. Preferably, a liquid, UV curable (i.e., curable upon exposure to ultra-violet light) adhesive, such as that commerically available from Norland Products, Inc. as Norland Optical Adhesives 68 and 81.

The closed support frame of the invention may be in any shape and size suitable for attachment to a photo mask or reticle such that the pellicle film does not touch and the frame does not interfere with the work surface of the mask or reticle. Typically, the support frame is circular with a diameter of 1-6 inches, or square with sides of 1-6 inches. The material of the support frame should have high strength, a low tendency to attract dust, and a light weight. Hard plastics, and metals such as aluminum, and aluminum alloys can all be used for the support frame. Aluminum alloys, particularly machined, anodized aluminum, have been found to be particularly satisfactory, and are accordingly preferred.

Figure 2A:
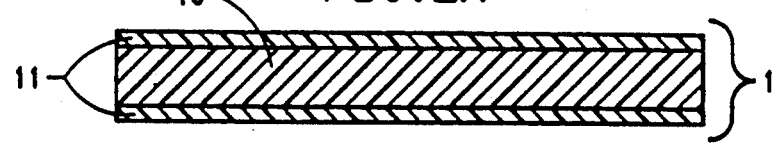
FIGS. 2A, 2B and 2C are cross-sectional views of films which can be used in the pellicles of the present invention.
Figure 2B:
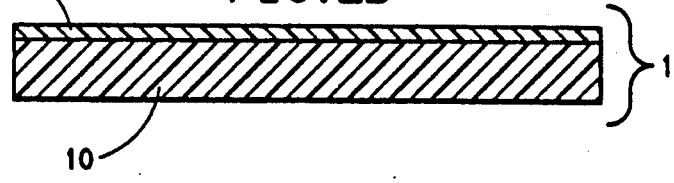
Figure 2C:
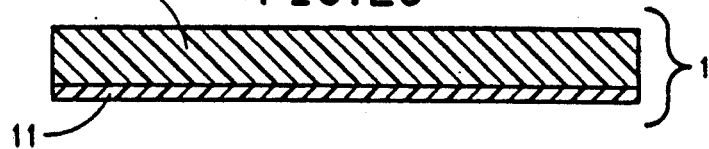

The present invention will be more fully understood by reference to the drawings, in which FIG. 1 illustrates a pellicized mask. The mask 3 is transparent and, typically, composed of silica. A pattern 4 is coated on the upper surface of mask 3. This pattern is encompassed by support frame 2 and covered by pellicle film 1. The pellicle film 1 is shown in greater detail in FIG. 2, and comprises a core layer 10 having an antireflective layer 11 on both sides thereof. Other embodiments of the invention are shown in FIGS. 2A and 2B. In FIG. 2A, the antireflective layer 11 is only on the top side of the core, while in FIG. 2B an antireflective layer 11 is on only the bottom side of the core. Radiant energy is projected from a source above the pellicle film through the film, pattern and mask onto a photoresist coated wafer in order to produce integrated circuits.

The perfluoropolymers used to coat the core pellicle film in the present invention exhibit properties which are especially desirable for pellicle antireflective layers. Such properties include low absorption and dispersion of light in a broad range of wavelengths, low water absorption to reduce sagging, greater durability to permit repeated exposure, low refractive indices, low surface energies to reduce particulate adhesion and good chemical resistance to solvents and cleaning agents. In addition, these perfluoropolymers exhibit outstanding adhesion to the core films typically used for pellicle construction, and are similarly compatible with adhesives used for pellicle assembly.

Although the foregoing discussion and the following examples are directed primarily to thin optical films having only a core layer and a perfluoropolymer antireflective layer on one or both sides thereof, the invention is not so limited. The ordinary artisan will recognize that additional layers such as antistatic layers and cooperating antireflective layers, may also be part of the thin optical film of this invention. Conventional methods such as spin-coating may be used to produce these films having additional layers.

In the following examples, the preferred method for making a pellicle film which was described above was used to prepare coated pellicle films.

EXAMPLES

Example 1

A core film was prepared from a nitrocellulose solution which was spin coated onto a glass substrate, lifted and then baked to evaporate solvent. The resulting uniform, 2.85 micron thick, nitrocellulose film transmitted about 82% to about 99% of incident light at wavelengths of 300 to 800 nanometers. At wavelengths of 350 to 450 nanometers, the amount of incident light transmitted by this film varied from about 85% to 99%.

A perfluoropolymer was prepared by pyralyzing a low molecular weight perfluoropolymer having 55.5 weight % TFE, 42.6 weight % PMVE and 1.90 weight % 8-CNVE randomly copolymerized, (inherent viscosity of 0.57 at 30 C.) at 345 C. for 10 hours in air. The inherent viscosity of the pyrolyzed polymer was 0.40 at 30 C. The pyrolyzed polymer was dissolved in Fluorinert ® FC-40 Electronic Liquid to provide a 1.5 weight % solution. The solution was filtered through a 0.2 micron absolute filter and spin-coated onto the nitrocellulose film. After the first side of the nitrocellulose layer was coated with the solution, a lifting frame was attached to the polymer coated nitrocellulose film. The film was lifted from the substrate and the oppostie side of the nitrocellulose layer was coated by rotating the lifting frame 180° and repeating the spin coating process. The nitrocellulose layer coated on both sides with the sintered polymer solution was heated to remove solvent. The resulting film transmitted greater than 97% incident light at wavelengths of 350 to 450 nanometers. When adhered to an aluminum support frame with standard optical adhesive, the seal between the film and the frame withstood normal 30 psi air streams used for testing, impinging the seal at a distance of ¼ inch for thirty seconds.

LIST OF ABBREVIATIONS

TFE = tetrafluoroethylene
PMVE = perfluoro (methyl vinyl) ether
8-CNVE = perfluoro-(8-cyano-5-methyl-3,6-dioxa-1-octene)

We claim:

1. A pellicle comprising a thin optical film which is tautly adhered to one edge of a closed support frame, said film comprising a core layer having an index of refraction of about from 1.32 to 1.80 and a thickness of about 0.3 to 20 microns, the improvement wherein the film further comprises at least one antireflective layer comprising a low molecular weight pyrolyzed perfluoropolymer comprising randomly copolymerized units of tetrafluoroethylene, perfluoro (alkyl vinyl) ether and a cure site monomer, the cure site monomer being selected from the group consisting of vinylidene fluoride, perfluoro-(8-cyano-5-methyl-3,6-dioxa-1-octene), bromotetrafluorobutene or perfluoro (2-phenoxypropyl vinyl ether).

2. A pellicle of claim 1 wherein the core layer comprises a polymer selected from the group consisting of polycarbonates, polyacrylates, polyvinylbutyrates, polyethersulfones, polysulfones and cellulose derivatives.

3. A pellicle of claim 2 wherein the core layer consists essentially of nitrocellulose.

4. A pellicle of claim 3 wherein the film transmits greater than 97% of incident light in the band of 350 nanometers to 450 nanometers.

5. A pellicle of claim 1 wherein the film comprises a core layer and an antireflective layer on one side of the core layer.

6. A pellicle of claim 1 wherein the film comprises a core layer and an antireflective layer on both sides of the core layer.

7. A pellicle of claim 1 wherein the perfluoropolymer comprises a low molecular weight perfluoropolymer comprising randomly copolymerized units of tetrafluoroethylene, perfluoro (methyl vinyl) ether and a perfluoro-(8-cyano-5-perfluoro-(8-cyano-5-methyl-3,6-dioxa-1-octene) cure site.

8. The pellicle of claim 7 wherein the low molecular weight perfluoropolymer comprising randomly copolymerized units of tetrafluoroethylene, perfluoro (methyl vinyl) ether and a perfluoro-(8-cyano-5-perfluoro-(8-cyano-5-methyl-3,6-dioxa-1-octene) cure site.

9. The pellicle of claim 8 wherein the inherent viscosity of the perfluorpolymer is 0.40 at 30° C.

* * * * *